US006928748B2

(12) United States Patent
Chen et al.

(10) Patent No.: US 6,928,748 B2
(45) Date of Patent: Aug. 16, 2005

(54) METHOD TO IMPROVE POST WAFER ETCH CLEANING PROCESS

(75) Inventors: Jia-Ren Chen, Tainan (TW); Li-De Hsu, Tainan (TW); Chin-Chia Kuo, Tainan (TW); Hann-Huei Tsai, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/686,150

(22) Filed: Oct. 16, 2003

(65) Prior Publication Data

US 2005/0091874 A1     May 5, 2005

(51) Int. Cl.[7] ............................................. F26B 7/00

(52) U.S. Cl. ............................. 34/445; 34/77; 34/78

(58) Field of Search ..................... 34/75, 76, 77, 34/78, 80, 410, 444, 445, 467; 134/6, 902

(56) References Cited

U.S. PATENT DOCUMENTS

| | | | | |
|---|---|---|---|---|
| 5,580,421 A | * | 12/1996 | Hiatt et al. ................. | 438/708 |
| 6,134,807 A | * | 10/2000 | Komino et al. .............. | 34/418 |
| 6,158,141 A | * | 12/2000 | Asada et al. .................... | 34/74 |
| 6,354,311 B1 | * | 3/2002 | Kimura et al. ................ | 134/61 |
| 6,357,142 B1 | * | 3/2002 | Bergman et al. ............. | 34/410 |

* cited by examiner

Primary Examiner—Stephen Gravini
(74) Attorney, Agent, or Firm—Tung & Associates

(57) ABSTRACT

A method and apparatus for performing a semiconductor process wafer drying process, the method provides a semiconductor wafer having a process surface disposed in an enclosed drying space following exposure of the process surface to water; supplying a solvent vapor to the drying space at a predetermined concentration from a solvent vapor source and at least one solvent vapor supply line; determining at least one of a solvent vapor concentration and a solvent vapor temperature in the drying space; and heating in response to the determined solvent concentration at least one of at least a portion of one of the solvent vapor source, the at least one solvent vapor supply line, and at the drying space to alter the solvent vapor concentration in the drying space.

21 Claims, 2 Drawing Sheets

METHOD TO IMPROVE POST WAFER ETCH CLEANING PROCESS

FIELD OF THE INVENTION

This invention generally relates to semiconductor wafer manufacturing and more particularly to a method for vapor drying semiconductor process wafers following an anisotropic plasma assisted etch process and a rinsing process.

BACKGROUND OF THE INVENTION

In creating a multiple layer (level) semiconductor devices on a semiconductor wafer, each layer making up the device may be subjected to one or more deposition processes, for example using chemical vapor deposition (CVD) or physical vapor deposition (PVD) and usually including one or more dry etching processes. A critical condition in semiconductor manufacturing is the absence of particulates on the wafer processing surface, since microscopic particles may interfere with and adversely affect subsequent processing steps leading to device degradation and ultimately semiconductor process wafer rejection.

While the wafer cleaning process has been always been a critical step in the semiconductor wafer manufacturing process, ultraclean wafers are becoming even more critical to device integrity. For example, as semiconductor feature sizes decrease, the detrimental affect of particulate contamination increases, requiring removal of ever smaller particles. For example, particles as small as 5 nm are no longer acceptable in many nano-integrated circuit manufacturing processes. To adequately meet requirements for ultraclean wafers in ULSI and VLSI the wafer surface must be essentially free of contaminating particles.

Processes that frequently result in particulate wafer contamination include plasma etching processes, for example a reactive ion etch (RIE) process including both anisotropic etching of dielectric insulating layers to form vias and metal etching of metal layers to form metal interconnect lines.

Typically, to reduce processing times and increase throughput, in prior at processes, ex-situ cleaning processes are performed following particle contaminating generating processes. For example, common particle removal mechanisms which may be exploited in the wet cleaning process, depending on the particle and the manner of adhesion to the wafer surface, including oxidizing degradation and dissolution and electrical repulsion between a particle and the wafer surface.

Standard wafer cleaning processes typically employ a dipping process whereby a plurality (batch) of process wafers are dipped sequentially in a series of solution baths. Following the chemical bath treatment a wafer rinse process is typically carried out, for example including wafer scrubbing by DI water. The scrubber utilizes a high-pressure spray of DI water with a retractable cleaning brush. Following the DI rinse process the process wafer is dried for example, using a solvent vapor drying process using a solvent such as isopropyl alcohol (IPA).

Vapor drying processes have been proposed in the prior art that utilize a solvent vapor to dry the semiconductor wafer following the deionized water rinse. Removal of substantially all of the water is critical for subsequent processes which may involve metal deposition processes to fill etched openings in a dielectric insulating layer. Typically low-K (low dielectric constant) inorganic materials are used in modern integrated circuit manufacturing where the low-K dielectric is composed of interconnecting porous material that readily absorbs water. Subsequent processes, including dielectric or metal deposition processes may be detrimentally affected by the presence of water, including causing inadequate adhesion of the overlying layer.

One solvent drying technique that has been used with some success makes use of the Marangoni effect. In this method, the substrate is withdrawn from the DI rinse water in a controlled manner while a solvent vapor stream is directed at the wafer above the air/rinse solution interface. In a Marangoni dryer, the drying principal is based on the different surface tension of IPA and DI water. The surface tension of the DI water is lowered by forming an azeotropic mixture of water and solvent, for example, isopropyl alcohol (IPA), which aids the removal by enhanced flow of water from the wafer surface as the wafer is withdrawn from the DI water bath.

One problem with prior art solvent vapor drying processes is that the efficiency of the drying process is frequently unpredictable due to variation is the concentration of solvent in the solvent vapor. For example, prior art vapor drying processes have limited temperature control capabilities where temperature variations can impact the steady state concentration of solvent vapor delivered to the wafer surface. In addition, prior art processes including prior temperature control have proved insufficient in maintaining a sufficiently high solvent vapor concentration during wafer drying including high aspect ratio semiconductor features. Temperature variations within the wafer drying space and along the vapor supply lines can result in inconsistent and inadequate solvent vapor concentrations. As a result, wafer yields are lowered as a result of defects caused by an incompletely dry wafer surface as well as requiring unnecessarily extended drying times to ensure complete wafer drying.

These and other shortcomings of the prior art are overcome by use of the solvent vapor drying method and apparatus described below.

SUMMARY OF THE INVENTION

In accordance with teachings of the present disclosure, a method and apparatus is provided for performing a semiconductor process wafer drying process.

In a first embodiment, the method includes providing a semiconductor wafer having a process surface disposed in an enclosed drying space following exposure of the process surface to water; supplying a solvent vapor to the drying space at a predetermined concentration from a solvent vapor source and at least one solvent vapor supply line; determining at least one of a solvent vapor concentration and a solvent vapor temperature in the drying space during the drying process; and, selectively heating in response to the determined solvent concentration at least one of at least a portion of one of the solvent vapor source, the at least one solvent vapor supply line, and at the drying space to alter the solvent vapor concentration in the drying space.

A more complete understanding of the present embodiments and aspects of the invention may be better ascertained by referring to the following description taken in conjunction with the accompanying drawings.

DETAILED DESCRIPTION OF THE PREFERRED EMBODIMENTS

The present invention is directed at a solvent vapor drying process and apparatus, preferably using alcohol, for example, isopropyl (IPA) as the solvent, for removing water from a semiconductor process wafer surface following a deionized water rinsing process. While the method and apparatus of the present invention is explained with reference to a Marangoni type drying process, it will be appreciated that the method of and apparatus of the present invention may be used in other vapor drying processes including a static wafer drying process where the wafer is held in a static position in a vapor drying chamber following a rinsing process.

In addition, the method and apparatus of the present invention are particularly suitable for removing water from a wafer process surface following formation of vias in a dielectric insulating layer, preferably with a via diameter less than about 0.25 microns and an aspect ratio (depth to diameter) of greater than about 5. The method and apparatus of the present invention is further particularly advantageously used for removing water from wafer surfaces including metal interconnect lines formed in a metal etching process having line widths of less than about 0.25 microns with an aspect ratio of greater than about 4.

Figure 1:
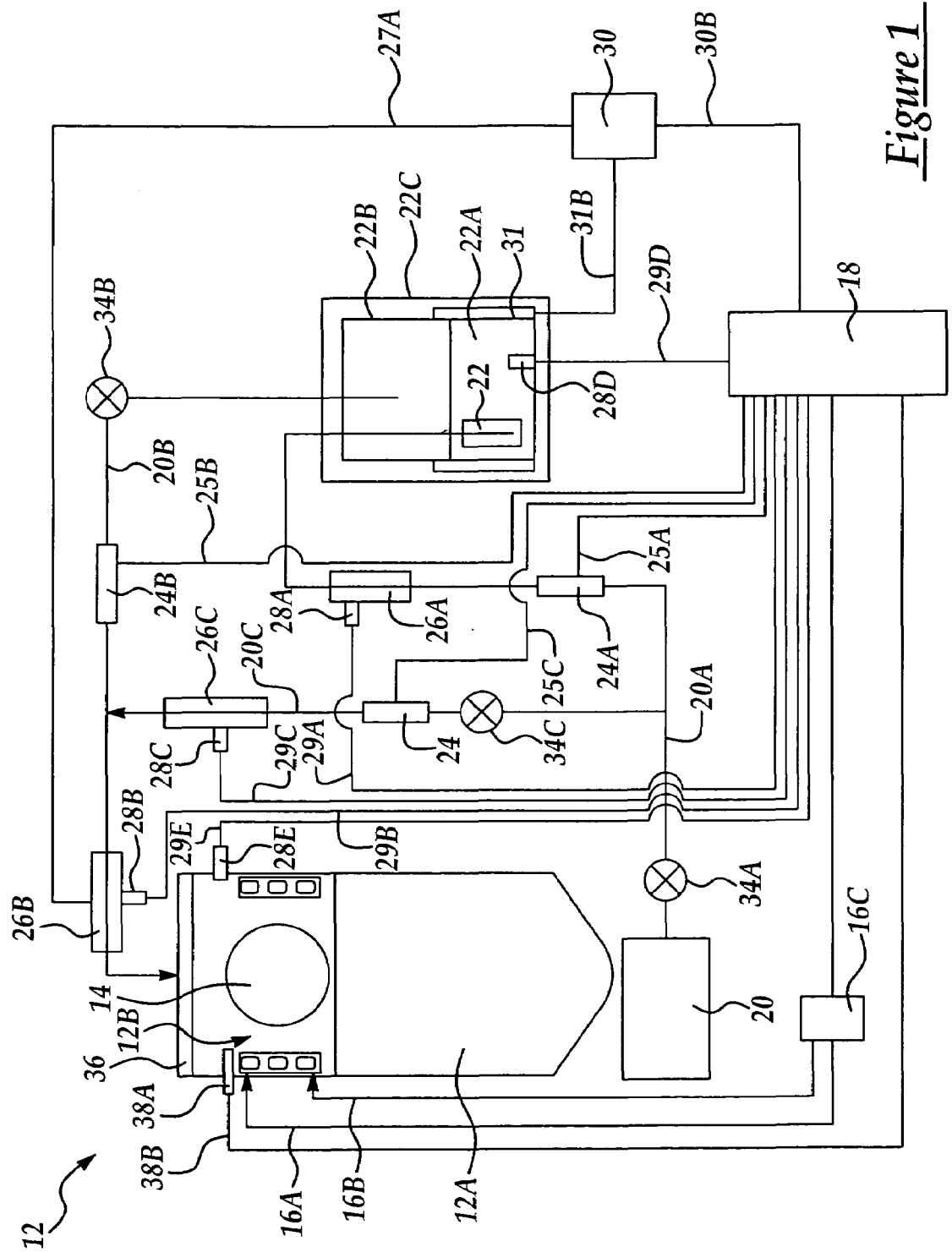
FIG. 1 is an exemplary wafer drying apparatus for carrying out embodiments of the method of the present invention.

Referring to FIG. 1, is shown a schematic diagram of an exemplary apparatus for carrying out the method of the present invention. Shown is enclosed container (vapor drying chamber) 12, including a bottom portion 12A for holding fluid and a top portion 12B including a drying space for contacting one or more wafers e.g., 14, with a solvent vapor in a vapor drying process. The bottom portion 12A may be provided for holding a fluid, for example deionized water for carrying out a wafer rinsing operation including inlets and outlets (not shown) for supplying and removing the fluid. The upper portion 12B is provided as a vapor drying space where wafers e.g. 14, for example a batch of wafers, are held in a conventional wafer holder (not shown) and slowly moved upward out of the rinsing fluid held in the bottom portion 12A, during the drying process. It will be appreciated that the wafers e.g., 14 may be held in a static position for contacting with solvent vapor following a rinsing process at another station, or during a Marangoni drying process where the wafers are withdrawn from a rinsing fluid in a controlled manner into the vapor drying space while being simultaneously contacted with a directed flow of the solvent vapor at the rinsing solution/vapor interface. For example, a conventional robotic arm (not shown) is provided for raising and lowering the wafers e.g., 14. For example, the wafers are withdrawn from a deionized water rinsing solution in the lower portion 12A in at a rate of from about 1 inches to about 8 inches per minute while simultaneously directing a stream of solvent vapor parallel to the wafer surfaces to contact the wafer surfaces including at an interface of the partially withdrawn wafer and the rinsing fluid.

According to an aspect of the present invention, a heating element, for example a heat exchange surface 16, for example a metal conduit formed in a coiled configuration for carrying heat exchange fluid, for example formed of copper or stainless steel, is provided inside the upper portion 12A positioned on either side the wafer in heat exchange relationship with a drying space surrounding the wafer e.g., 14. For example, the coiled configuration may include a coiled stack of metal conduit extending parallel to the wafer edge for at least about a wafer diameter to encompass the wafer diameter. Heat exchange fluid is supplied to the metal coil by supply lines e.g., 16A and 16B in fluid communication with a conventional heat exchange fluid pump 16C including fluid temperature sensing and heating elements (not shown) for controlling a temperature of the heat exchange fluid.

Preferably the heat exchange fluid pump 16C is in electrical communication with a controller 18 for outputting a temperature status of the heat exchange fluid to the controller and for receiving instructions from the controller for setting a heat exchange fluid temperature. The controller 18 preferably includes a conventional PID temperature control function either hardwired or pre-programmed to control a selected temperature for the heat exchange fluid. For example, the controller 18 may include a computer processing system including computer readable media preferably including preprogrammed instructions for controlling the collection, storage, and display of data. Preferably a manual control interface is provided for overriding preprogrammed instructions.

Also provided is an inert carrier gas supply 20 and gas supply lines e.g., 20A, 20B, and 20C. Gas supply lines 20A and 20B are provided for controllably supplying a pressurized inert carrier gas at a predetermined flow rate, for example nitrogen, through gas supply line 20A to a bubbler 22 and then through gas supply line 20B to the vapor drying space 12B. The bubbler 22 is submerged in solvent 22A held in solvent container 22B. Preferably the solvent includes alcohols or mixtures thereof, most preferably isopropyl alcohol (IPA). Gas supply line 20C is provided between gas supply line 20A and 20B to bypass the solvent in either a purging operation preceding or following the drying process, or to act as a make-up or diluent gas to control the concentration of solvent in the vapor during the drying process.

The gas supply lines e.g., 20A, 20B, and 20C, preferably include conventional mass flow controllers e.g., 24A, 24B, and 24C in electrical communication with the controller 18 via communication lines e.g., 25A, 25B and 25C for selectively controlling the inert gas and solvent vapor flow rate. Additionally, heating elements 26A, 26B, and 26C are optionally provided. Preferably, at least heating element 26B is provided along at least a portion of gas supply line 20B for heating the gas supply line 20B to prevent premature solvent vapor condensation in the gas supply line. More preferably, at least heating elements 26B and 26C are provided at least along a portion of respective gas supply lines 20B and 20C to prevent premature solvent condensation.

For example, the heating elements e.g., 26A, 26B, and 26C may be flexible resistive heating material including resistive heating wiring, for example conventional heating tape, provided along at least a portion of the gas supply lines 20A, 20B, and 20C and preferably including temperature sensing elements e.g., 28A, 28B, and 28C in communication with the controller 18 via communication line 29A, 29B, and 29C for selectively sensing and controlling a temperature of the heating elements 26A, 26B, and 26C, preferably by a conventional PID (proportional, integral, and differential) function.

For example the PID function includes a heater control subroutine where the temperature is determined by a voltage output of a temperature sensor (e.g., thermocouple) 28A, 28B, and 28C and compares the measured temperature to the set point temperature, and increases or decreases current applied to the heating elements module through power supply 30 to obtain the set point temperature. The heating elements e.g., 26A, 26B, and 26C, are supplied by a power supply e.g., 30 via power supply line 27A (only power supply line 27A shown for clarity) in communication with controller 18 via communication line e.g., 30B for selectively outputting a voltage or current.

For heating the gas supply lines to lower temperatures, for example less than about 28° C., the heating elements may be formed by a partially enclosed space at least partially surrounding portions of the gas supply lines for passing heated air over the gas supply lines. For example, a partially enclosed space for passing heated air may include larger diameter tubing surrounding one or more of the gas supply lines with the partially enclosed space being an air space between the inner diameter of the larger diameter tubing surrounding one or more of the gas supply lines to provide a heated air gas flow pathway parallel to the gas supply lines. For example, conventional heated air supply sources (not shown) are provided in gaseous communication with the heated air gas flow pathway to supply heated air over the gas supply lines. It will also be appreciated that combinations of heating elements, including resistively heated elements in contact with the gas supply lines and heated air space surrounding the gas supply lines may be used for controlled heating of the gas supply lines during the vapor drying process. For example, a portion of the gas supply lines may be provided in an enclosed space where heated air is recirculated by conventional air heating circulation means, for example including a resistive heating element and an air blower to pass air over the resistive heating element and into the enclosed space surrounding the gas supply lines.

Preferably, a temperature sensor 28D in electrical communication with controller 18 via communication line 29D is positioned to measure the temperature of the solvent 22A in solvent container 22B and is in electrical communication with control 18 via communication line 29D for receiving a temperature indication (e.g., voltage). Preferably a heating element 31 is provided in contact with the solvent container 22B surrounding at least a portion of the solvent 22A, preferably surrounding all of the solvent. For example, the heating element 31 may be a flexible material including resistive heating elements, e.g., conventional heating tape, wrapped in heat exchange contact with the solvent container 22B and controllably supplied by power supply 30 via power supply line 31B upon receiving an output signal from controller 18 in response to a determined solvent temperature according to temperature sensor 28D. The solvent container 22B may optionally be enclosed in a second container, e.g., 22C for providing a more stable temperature environment.

In exemplary operation, nitrogen gas is supplied along gas supply line 20A to gas bubbler 22 where solvent, preferably isopropyl alcohol (IPA), evaporates into the nitrogen gas to create a solvent vapor which is then carried along gas supply line 20B. The gas flow rate is controllably supplied by at least one mass flow controller, e.g., 24A, 24B, disposed respectively in gas supply lines 20A and 20B, in response to an output signal from controller 18. The solvent vapor is prevented from condensing onto the gas supply lines to avoid reducing the vapor solvent concentration by the heating element 26B provided along at least a portion of the gas supply line 20B, preferably provided over a substantial portion of the gas supply line 20B, for example, about at least half the length of the gas supply line measured from the vapor drying chamber inlet. The temperature of the gas supply lines, e.g., 20B is preferably controlled at a temperature, preferably at least about equal or greater to the solvent temperature. It will be appreciated that the solvent condensation temperature depends on the solvent vapor pressure and solvent concentration in the solvent vapor.

Preferably the gas supply lines e.g., 20B are controllably heated to a temperature at least as high as the solvent temperature, preferably higher, to allow re-evaporation in the event of per mature solvent condensation to maintain a solvent concentration in the carrier gas. Preferably, the heating elements e.g., 26B are maintained at within a temperature range of about 15° C. to about 35° C. during the vapor drying process. Preferably, the heating element temperature is controlled by the controller, for example including a conventional PID controller function, to within at least about plus or minus 2° C. of a predetermined setpoint temperature.

In exemplary operation, gas flow valves e.g., 34A, 34B and 34C, for example pneumatically operated, are provided to selectively control a gas flow pathway along gas supply line 20A to gas supply line 20B, or selectively along bypass gas supply line 20C to gas supply line 20B, and then to wafer drying space 12B. For example, valve 34B is a selectable for two-way or three-way gas flow, for example allowing simultaneous supply along gas supply lines 20A and 20C to act as either a gas by-pass for purging the lines following a vapor drying process or providing a make-up gas flow to dilute the concentration of the solvent in the solvent vapor prior to entering wafer drying space 12B during the vapor drying process.

In exemplary operation, the solvent/carrier gas mixture (solvent vapor), preferably IPA vapor, is provided into an upper portion 12B of the drying container by gas supply line 20B through a manifold 36, which may also functions as a container lid, including a plurality of manifold openings (not shown) for directing the solvent vapor parallel to the wafer drying surface and at a rinse solution/vapor interface in a Marangoni vapor drying process.

According to an aspect of the present invention, it has been found that IPA vapor prematurely condenses during the vapor drying process, for example along cooler portions of the container 12 in the upper portion drying space 12B to reduce a concentration of IPA in the vapor over the vapor drying period. Reduction in solvent concentration over the drying period, frequently results in improper drying including leaving contaminated areas referred to as wet spots on the wafer surface. As a result, subsequent processes such as metal or dielectric layer deposition are compromised resulting in surface defects including poorly adhering deposition layers thereby reducing device reliability and wafer yield.

Preferably, the wafer drying space 12B includes a conventional vapor concentration sensor for sensing a solvent concentration and/or temperature. For example, a conventional solvent vapor concentration sensor 38A is provided preferably in electrical communication with controller 18 by communication line 38B for sending an electrical signal, for example voltage, to the controller 18. Alternatively or additionally, temperature sensor 28E is provided in an upper portion of the wafer drying space 12B and communicates with controller 18 via communication line 29E for communicating a temperature status indicator, e.g., voltage of the wafer drying space 12B.

In operation, the controller is preprogrammed to follow a decision tree to maintain or change an IPA vapor concentration or temperature in the vapor drying space in response to a signal from a vapor concentration sensor e.g., 38A and/or a temperature sensor e.g., 28E. For example, upon determining at least one of a solvent vapor concentration or wafer drying space temperature is outside a predetermined concentration window, the controller 18 outputs a signal to the heat exchange fluid pump 16C to increase or decrease a heat exchange fluid temperature flowing through heat exchange surface 16.

Alternatively, or following the step of increasing a heat exchange fluid temperature flowing through heat exchange surface 16, a temperature of the solvent 22A may be controllably increased to a predetermined temperature by increasing heat supplied by solvent container heating element 31 and increasing one or more of the gas supply line heating elements e.g., 26B, to a predetermined temperature. In addition, mass flow controller e.g., one of 24A and 24B may be signaled by the controller to provide an increased flow rate of the solvent vapor to the wafer drying space. It will be appreciated that the process involves continuous periodic measurement and control variable adjustment to maintain a desired vapor concentration in the vapor drying space. For example, proportional, integral, and differential adjustments to the control variables may be used to achieve a targeted solvent concentration and/or temperature in the drying space. It will be appreciated that the particular decision tree followed in controlling various temperatures such as at least one of the vapor space temperature, the solvent temperature and the solvent vapor supply line temperature and solvent vapor flow rates to maintain a predetermined solvent vapor concentration within the wafer drying space will depend in part on the sensed concentration of the solvent vapor and the desired concentration of the solvent vapor including a desired response time.

It has been found according to an aspect of the present invention that in a vapor drying process for drying a process wafer, for example removing water from high aspect ratio features following a rinsing process, for example including via openings formed in a dielectric low-K insulating layer, or high aspect ratio metal interconnect lines formed in a metal layer etching process, that high concentrations of IPA vapor are required to remove the water. For example, wafer surfaces including low-K (low dielectric constant) materials, for example inorganic porous silicon dioxide based materials such as carbon doped oxide, also referred to as organosilane silicate glass (OSG), tend to absorb water, requiring high concentrations of IPA in the drying vapor to adequately remove the water following a rinsing operation.

It has been found that at high IPA vapor concentrations, for example at or near IPA saturation in the IPA/gas mixture, that relatively small temperature variations in the vapor drying apparatus including the solvent supply container, the gas supply lines, and the wafer drying space can cause premature condensation of the IPA altering the desired IPA vapor concentration over the drying period. As a result, it has been advantageously found that high concentrations of IPA, for example from about 8,000 to about 20,000ppm of IPA in the solvent vapor supplied and maintained in the wafer drying area over the drying period can be better controlled over the drying period by controllably heating at least portions of the solvent supply, gas supply lines, and wafer drying space. According to an aspect of the present invention, at least one of the solvent container, the gas supply lines, and the wafer drying space are heated to a predetermined temperature, preferably within a range of about 15° C. to about 35° C., more preferably about 20° C. to about 30° C. during the wafer drying process. More preferably, at least the solvent container and the wafer drying space are heated and maintained with a predetermined temperature window during the wafer drying process. Most preferably, the solvent container, the gas supply lines, and the wafer drying space are heated and maintained within a predetermined temperature window during the wafer drying process.

For example, it has been found that carrying out wafer vapor drying processes, particularly with process wafers including porous surfaces and/or high aspect ratio openings, that the vapor drying process is significantly more efficient, improving wafer yield up to about 5 percent and decreasing a vapor drying time by up to about 20 percent.

Figure 2:
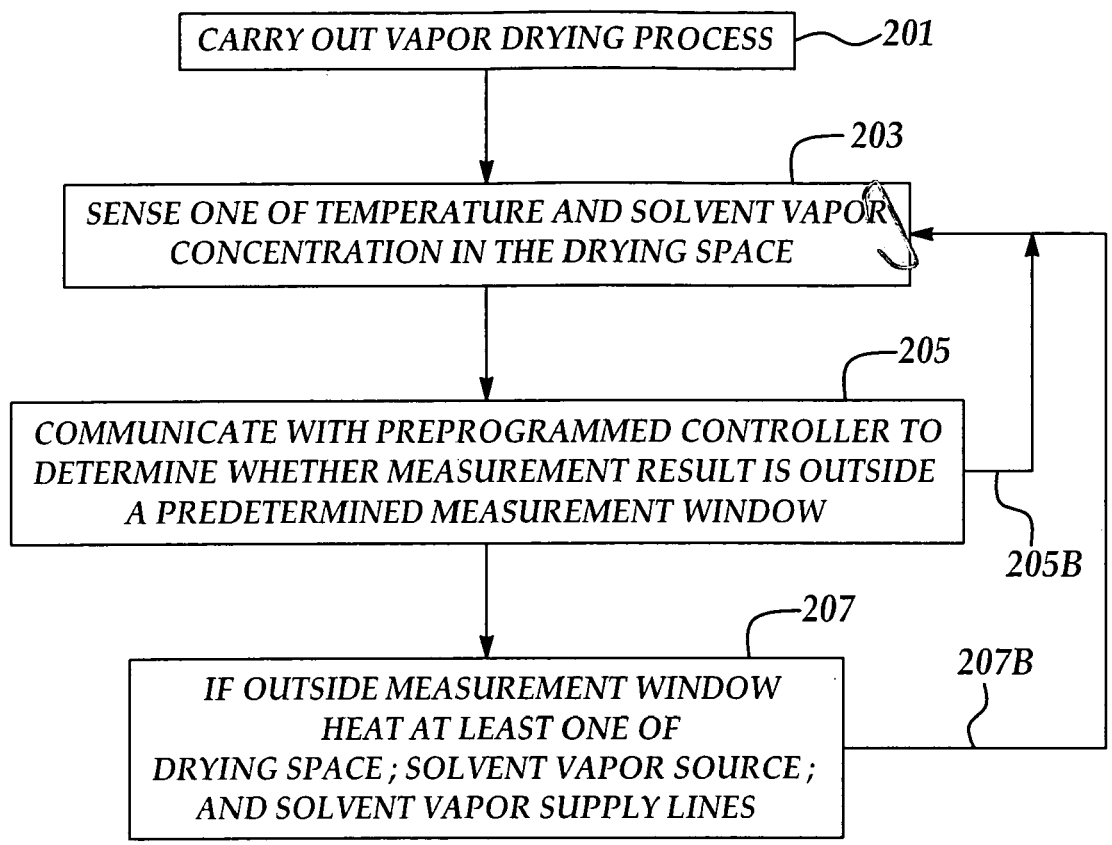
FIG. 2 is a process flow diagram including several embodiments of the present invention.

Referring to FIG. 2 is a process flow diagram including several embodiments of the present invention. In process 201, a vapor drying process is carried out including supplying a solvent vapor to a vapor drying space. In process 203, one of a solvent vapor concentration in the drying space and a drying space temperature is sensed to determine a measurement result. In process 205, a measurement result signal is passed to a controller where the controller determines whether the measurement result is outside a predetermined measurement result window. If the measurement result is within the predetermined measurement result window, the process 203 is repeated according to process directional arrow 205A. If the measured result is determined outside a predetermined measurement result window, in process 207, one of the drying space, a solvent vapor supply line and a solvent vapor source are controllably heated in response to a controller output to achieve a measurement result within a predetermined measurement result window. Process directional arrow 207B indicates that the measurement process and controller determination process are continuously repeated as needed in processes 203 and 205.

While the disclosed embodiments have been described in detail, it should be understood that various changes, substitutions and alternations can be made to the embodiments without departing from their spirit and scope.

What is claimed is:

1. A method for performing a semiconductor process wafer drying process comprising the steps of:
   providing a semiconductor wafer having a process surface disposed in an enclosed drying space following exposure of the process surface to water;
   supplying a solvent vapor to the drying space at a predetermined concentration from a solvent vapor source and at least one solvent vapor supply line;
   determining at least one of a solvent vapor concentration and a solvent vapor temperature in the drying space during the drying process; and,
   selectively heating in response to the determined solvent concentration at least one of at least a portion of one of the solvent vapor source, the at least one solvent vapor supply line, and at the drying space to alter the solvent vapor concentration in the drying space.

2. The method of claim 1, wherein the solvent vapor concentration is maintained within a range of about 8,000 to about 20,000 ppm.

3. The method of claim 1, wherein the at least a portion of at least one of the solvent vapor source, the at least one solvent vapor supply line, and at the drying space are maintained within a temperature range of about 15° C. to about 35° C. during the drying process.

4. The method of claim 1, wherein the solvent vapor comprises an alcohol.

5. The method of claim 4, wherein the alcohol comprises isopropyl alcohol.

6. The method of claim 1, wherein the solvent vapor source comprises an inert gas flow through the solvent to form the vapor solvent.

7. The method of claim 1, further including selectively increasing a solvent vapor flow along the at least one solvent vapor supply line in response to a determined solvent vapor concentration.

8. The method of claim 1, wherein the drying space is heated by a heat exchange surface positioned proximal to at least a portion of the semiconductor wafer edge.

9. The method of claim 1, wherein the solvent vapor is directed in a stream parallel to the process surface.

10. The method of claim 1, wherein the solvent vapor is directed at the process surface/fluid interface.

11. The method of claim 1, wherein the solvent vapor is supplied simultaneously with the process wafer being withdrawn from a water containing rinsing fluid into the drying space.

12. The method of claim 11, wherein the wafer is withdrawn from the in the drying space at a rate of about 1 to about 8 inches per minute.

13. The method of claim 1, wherein temperature sensors are provided in communication with a controller to determine a temperature of the at least one of the solvent vapor source, the at least one solvent vapor supply line, and the drying space.

14. The method of claim 1, wherein gas flow rate controllers are provided in responsive communication with a controller to control a flow rate of the solvent vapor in the at least one solvent vapor supply line.

15. The method of claim 1, wherein heating elements are provided in heat exchange relationship with the at least one solvent vapor source and the at least one solvent vapor supply line said heating elements in responsive communication with a heating source which is in responsive communication with a controller to selectively control a sensed temperature to reduce condensation of the solvent vapor.

16. A wafer drying apparatus for carrying out a process wafer vapor drying process in a micro-integrated circuit manufacturing process comprising:

an enclosed vapor drying space for positioning at least one process wafer and contacting the at least one process wafer with a stream of solvent vapor the enclosed vapor drying space including heat exchange surfaces positioned to be parallel to a wafer drying position during a vapor drying process;

the vapor drying space further including at least one of a solvent vapor concentration sensor and a temperature sensor for respectively sensing one of a solvent vapor concentration and a solvent vapor temperature;

a solvent vapor source including a vapor source heating element in heat exchange relationship with the solvent vapor source and a vapor source temperature sensor disposed for sensing at least one of a vapor source heating element temperature and a solvent vapor source temperature; and, at least one solvent vapor supply line comprising a gas flow rate controller disposed for carrying the solvent vapor from the solvent vapor source to the vapor drying space;

wherein the at least one gas supply line includes at least one supply line heating element for heating at least a portion of the at least one gas supply line and at least one gas supply line temperature sensor for sensing a gas supply line temperature.

17. The wafer drying apparatus of claim 16, wherein the at least one of a solvent vapor concentration sensor and a temperature sensor are in communication with a controller for responsively controlling a heat exchange surface temperature to control the vapor drying space temperature.

18. The wafer drying apparatus of claim 16, wherein the vapor source temperature sensor is in communication with a controller for responsively controlling a vapor source heating element to control the solvent vapor source temperature.

19. The wafer drying apparatus of claim 16, wherein the vapor source temperature sensor is in communication with a controller for responsively controlling a vapor source heating element to control the solvent vapor source temperature.

20. The wafer drying apparatus of claim 16, wherein the at least one gas supply line temperature sensor is in communication with a controller for responsively controlling the at least one supply line heating element to control the at least one gas supply line temperature.

21. The wafer drying apparatus of claim 16, wherein the solvent vapor stream inlet is positioned in an upper portion of the vapor drying space to direct a solvent vapor flow downward and parallel to a process wafer surface in a wafer drying process.

* * * * *